US 7,095,803 B2

(12) United States Patent
Gazsi et al.

(10) Patent No.: US 7,095,803 B2
(45) Date of Patent: Aug. 22, 2006

(54) METHOD OF RECONSTRUCTING DATA TRANSMITTED OVER A TRANSMISSION PATH IN A RECEIVER AND CORRESPONDING DEVICE

(75) Inventors: Lajos Gazsi, Düsseldorf (DE); Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 779 days.

(21) Appl. No.: 10/225,637

(22) Filed: Aug. 22, 2002

(65) Prior Publication Data
US 2003/0048858 A1  Mar. 13, 2003

(30) Foreign Application Priority Data
Aug. 24, 2001  (DE)  ................. 101 41 597

(51) Int. Cl.
H04L 27/22  (2006.01)
(52) U.S. Cl. ............... 375/316; 375/232; 375/350; 375/345; 375/346; 369/59.22; 360/46
(58) Field of Classification Search ................ 375/316, 375/229, 232, 350, 345, 376; 360/46, 25, 360/65, 67; 369/59.21, 59.22
See application file for complete search history.

(56) References Cited

U.S. PATENT DOCUMENTS

| 5,509,030 | A |   | 4/1996  | Mortensen ............ 375/232 |
| 5,963,525 | A | * | 10/1999 | Audoin et al. ........ 369/59.22 |
| 5,999,349 | A |   | 12/1999 | Choi ..................... 360/46 |
| 6,130,793 | A | * | 10/2000 | Ohmori et al. ............ 360/53 |

FOREIGN PATENT DOCUMENTS

| DE | 196 26 599 A1 | 1/1998 |
| EP | 0 594 246 B1 | 4/1994 |
| EP | 0 748 124 A2 | 12/1996 |
| EP | 0 805 447 A2 | 11/1997 |
| EP | 0 822 554 A2 | 2/1998 |
| WO | WO 98 52330 | 11/1998 |
| WO | WO 99 57898 | 11/1999 |

OTHER PUBLICATIONS

International Search Report dated Sep. 12, 2003 (5 pp.) for corresponding application No. PCT/EP02/08294.
H. Meyr, et al., Synchronization in Digital Communications,vol. 1, "Phase-Frequency-Locked Loops, and Amplitude Control", John Wiley & Sons, New York, pp. 273-282 (1990).

(Continued)

Primary Examiner—Phuong Phu
(74) Attorney, Agent, or Firm—Peter F. Corless; Steven M. Jensen; Edwards Angell, Palmer & Dodge LLP

(57) ABSTRACT

To reconstruct data transmitted over a transmission path, for example a cable, the corresponding signal received by the receiver is firstly amplified and subsequently made discrete by means of an A/D-converter (6), in order to obtain a suitable digital signal, whereby the signal amplified for this purpose is scanned with a relatively low sampling rate, which can frequently lie in the Nyquist range or can be even less than the Nyquist frequency. Subsequently the signal made discrete in this way is filtered by means of a digital high pass filter (8) and equalized by means of a digital cable approximation filter (9) to compensate any distortion occurring during the transmission over the transmission path. By means of a phase locked loop (14, 18) a regenerated clock (CLK) and synchronous with this clock the originally transmitted data (DATA) is recovered from the digital signal processed in this way.

30 Claims, 3 Drawing Sheets

OTHER PUBLICATIONS

Figure 1:
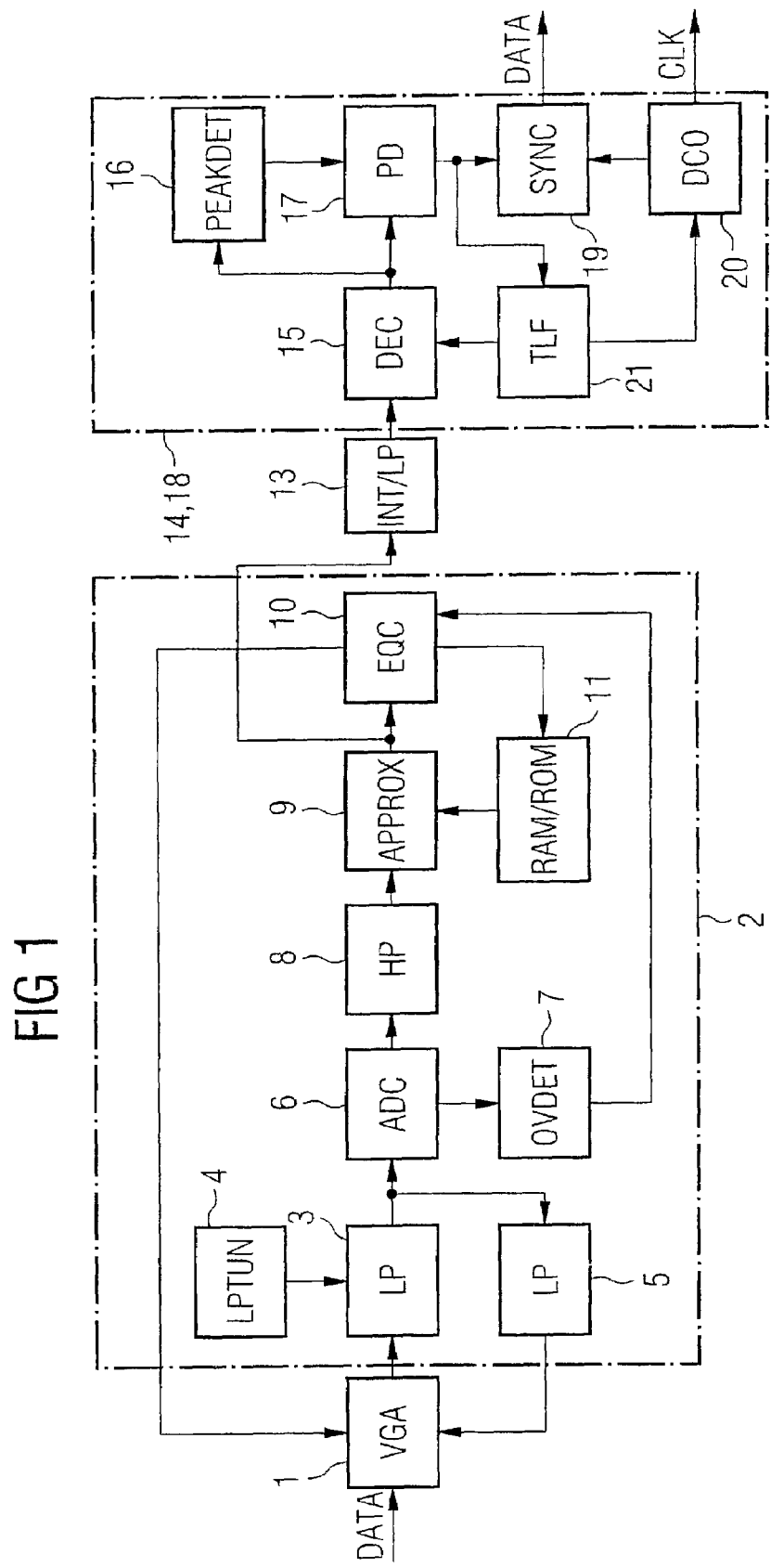

U. Lambrette, et al., "Variable Sample Rate Digital Feedback NDA Timing Synchronization", Global Telecommunications Conference 1996. Globecom '96, Communications: The Key to Global Property London, UK Nov. 18-22, 1996, New York, IEEE, US, pp. 1348-1352.

J. Baltersee, et al., "Performance Bounds for a UMTS Rake Receiver with Imperfect Timing Synchronisation", IEEE Global Telecommunications Conference. Globecom '99, pp. 105-109 (1999).

* cited by examiner

METHOD OF RECONSTRUCTING DATA TRANSMITTED OVER A TRANSMISSION PATH IN A RECEIVER AND CORRESPONDING DEVICE

This invention relates to a method of reconstructing data transmitted over a transmission path, in particular non-scrambled data, in a receiver, the data being recovered from an analog signal, which has been distorted and attenuated through the transmission over the transmission path. Furthermore the present invention relates to a device configured accordingly.

In the case of digital fixed network transmission systems digital data in the form of rectangular or trapezoidal pulses are fed into a transmission cable, normally a copper or glass fibre cable and received at the other end of the cable by a receiver. At the same time due to the transmission the data signal is attenuated as regards amplitude and also distorted as regards phase position and group delay time, whereby it is additionally possible that it is affected by high and low frequent radio interference. The distorted signal arriving at the receiver consequently must be amplified and equalized in the receiver, before reconstruction or recovery of the data transmitted in the form of the signal is possible. For this purpose known receivers comprise an input end amplifier, an equalizer connected after the amplifier, a clock recovery circuit to regenerate the clock of the transmitted data and a data recovery circuit to recover the originally transmitted data, whereby a datastream synchronous with the regenerated clock is supplied by the data recovery circuit.

In known receivers in order to reconstruct data from an analog signal, which has been distorted and attenuated through the transmission over a transmission path, primarily analog circuit technology is used in the conventional way. A typical example of a receiver based in such a way on analog circuit technology is illustrated in FIG. 3.

The receiver includes a variable or programmable amplifier 1 ("Variable Gain Amplifier", VGA), which amplifies a data signal DATA fed to it. An equalizer 2 is connected after the amplifier 1. The equalizer 2 includes an analog antialiasing low pass filter 3 ("Low Pass filter", LP), which at the same time can be used to suppress crosstalk as well as noise sources. The output of this antialiasing low pass filter 3 is fed back via a further analog low pass filter 5 to suppress offset, whereby the amplification of the amplifier 1 is adjusted dependent on the output signal of this further low-pass filter 5. In addition the equalizer 2 comprises an analog cable approximation filter 9 ("APPROX") to compensate the distortion occurring on the particular transmission channel or particular transmission path. The output signal supplied by the cable approximation filter 9 is evaluated by a level detector 23 ("LEVDET") with regard to its amplitude and independently of this drives an equalizer control unit 10 ("Equalizer Control", EQC), in order to match in the best way possible the coefficients of the cable approximation filter 9 in discrete steps to the transmission function of the particular transmission path and to simulate in the receiver path of the receiver illustrated in FIG. 3 the inverse transmission function of the transmission path as accurately as possible. The amplitude of the analog signal emitted by the cable approximation filter 9 is checked by a further circuit block 22 ("Analog Loss", ALOSS) and unless a preset amplitude limit value is exceeded, detects that no sufficient analog signal level is present for reliable data recovery or data reconstruction. The data and clock recovery takes place through a unit 18 described as "Clock and Data Recovery Unit" (CDR) in combination with a phase locked loop ("Phase Locked Loop", PLL) 14. The clock CLK of the originally transmitted signal is recovered or regenerated by the unit 18 and a datastream DATA is emitted synchronous with this clock CLK.

In the configuration of the receiver various criteria must be considered, which result from the transmission standard to be applied in each case. Thus the clock recovery must also function in the case of data sequences, which have long zero sequences, as for example PRBS sequences ("Pseudo Random Binary Sequence") with up to 14 zeros following each other. Equally the jitter tolerance specified in each case must be met. Finally the receiver should also be designed in such a way that non-scrambled data, that is to say purely random data, can be reconstructed (with scrambling a datastream is jumbled up according to a defined mathematical polynom, whereby this technique serves to prevent constant signal patterns and ensures more uniform distribution of the signal energy over the whole frequency range).

Figure 3:
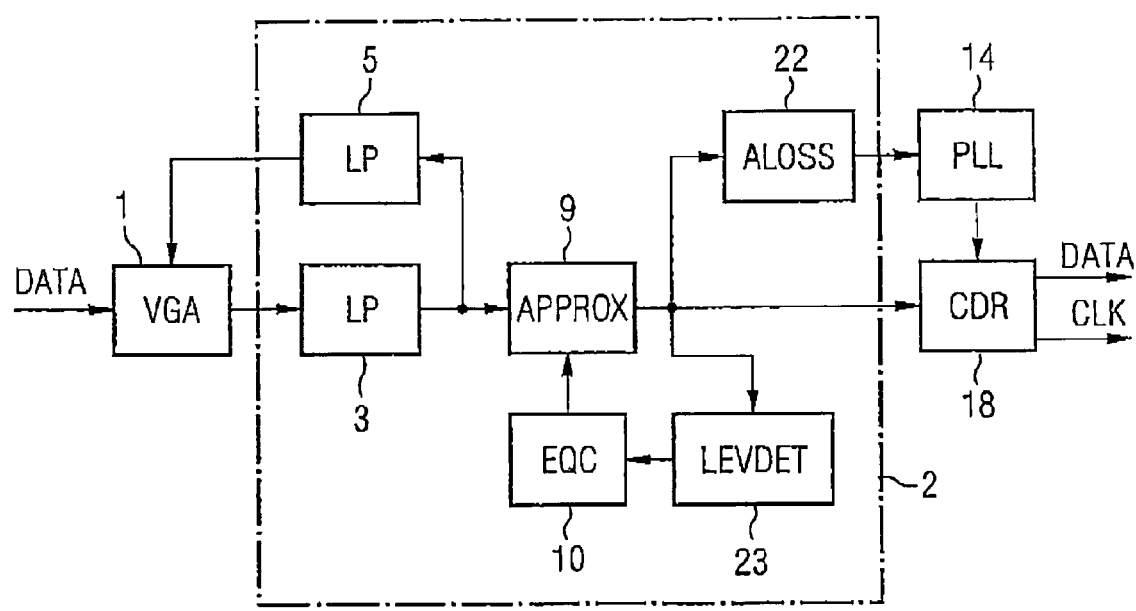

A disadvantage of conventional analog technology shown in FIG. 3 in particular is the fact that the adjusted pole and zero positions of the low pass filter 3 used and the cable approximation filter 9 are influenced by parasitic pole and zero positions, as a result of which the ideal adaption function of the receiver is diminished accordingly.

In addition analog technology of this type to rectify and reconstruct data is susceptible to production tolerances and adaptive variants of the transmission channel. In addition temperature and mechanical gradients can limit the functional quality of sensitive circuits in the receiver and therefore prevent faultless re-recognition of the attenuated and distorted signals.

Furthermore in the case of analog technology the number of the coefficient sets for the cable approximation filter 9 is limited, whereby the quality of the cable approximation is also limited. The coefficients of the cable approximation filter 9 calculated by system simulation are only ideal for a particular type of cable in the case of a given application condition. Variants in the application conditions, as for example varying cable lengths and different temperatures etc., often result in erroneous data recognition and therefore in greater bit error rates.

Finally it should also be remarked that in a cable-based transmission system in particular with long lengths of cable or generally in the case of high cable attenuation through the so-called $\sqrt{f}$ characteristic, that is to say through dependency of cable attenuation on the frequency and length of the cable, the distance from a support point and therefore of a coefficient set to the next support point and therefore to the next coefficient set is paramount for the bit error rate. If the distance between two support points in the transmission path selected in each case is too great in the event of high cable attenuation, the bit error rate increments disproportionately for intermediate values to the two adjacent support points. In order to counteract this property, the distance between two adjacent support points in the transmission path and therefore the distance between the coefficient sets of the two adjacent support points with high cable attenuations must be decreased and consequently the number of the support points must be increased. Owing to the previously explained parasitic influences and properties of analog technology in rectifying a distorted and at the same time attenuated signal received over the particular transmission path this can only be achieved in the case of analog technology to an insufficient extent.

The aim of the present invention is therefore to provide a method and device to reconstruct data transmitted over a transmission path, whereby the quality of rectification and data reconstruction can be improved at minimum expense. At the same time in particular the reconstruction of non-scrambled data is made possible with the present invention.

This aim is achieved according to the invention by a method with the features of claim 1 or a device with the features of claim 21. The sub-claims in each case define preferred and advantageous embodiments of this invention.

According to the invention the signal received by the receiver and transmitted over the particular transmission path is first amplified preferably with a programmable or variable amplifier and subsequently discretised with the aid of an A/D-converter, in order to obtain a suitable digital signal. Then this digital signal is filtered with the aid of a digital high pass filter to suppress noise sources below the lowest spectral level of the wanted signal (as well as possibly to suppress offset- and equal components) and fed to a digital cable approximation filter which can be implemented as an FIR- or IIR filter and to compensate any channel distortion occurring on the particular transmission path (for example through the transmission cable or a transformer at the transmitting end etc.). Therefore this digital cable approximation filter provides an equalized digital signal, from which the data originally transmitted over the transmission path can be recovered.

Before A/D-conversion the amplified received signal can undergo analog low pass filtering, the corresponding analog low pass filter on the one hand serving as antialiasing filter and on the other hand at the same time being able to suppress crosstalk and noise sources. The A/D-converter preferably operates at a relatively low sampling rate, whereby the received signal amplified by the variable amplifier can be scanned with a frequency in the Nyquist range (corresponding to double the data rate) or even a lower frequency. To adjust the band demarcation of the signal being made discrete for the input end analog low pass filter, filter tuning is carried out for pole stability, whereby the filter tuning or pole position of the analog low pass filter is automatically carried together with the data or symbol rate dependent on the transmission standard being applied in each case.

The output signal of the digital cable approximation filter can be evaluated by an equalizer control unit, which independently of this selects the appropriate filter coefficients for best possible compensation of channel distortion for the digital cable approximation filter and also adjusts the amplification of the input end amplifier.

The digital signal provided by the digital cable approximation filter preferably undergoes linear interpolation, in order to increase the data rate to improve the subsequent clock recovery. Preferably this linear interpolation is combined with low pass filtering, in order to filter out any frequency levels above the desired frequency arising through the interpolation. From the digital signal processed in this way with the aid of a phase locked loop by using a digitally controlled oscillator, the clock of the original transmission signal can be regenerated and with the aid of output data synchronisation, a datastream emitted with the originally transmitted data synchronous with this regenerated clock.

An additional digital low pass filter can be provided between the digital high pass filter and the digital cable approximation filter to band demarcate the input signal and to suppress crosstalk and noise sources. The digital high pass filter on the other hand is in particular provided directly after the A/D-converter with for example no low pass filtering or decimation taking place between the A/D-converter and the digital high pass filter.

With regard to the A/D-converter, overloading at the input of this A/D-converter can be detected, in order via the aforementioned equalizer control unit to control the amplification of the input end variable amplifier accordingly, as a result of which the bit error rate can also be improved.

Most elements of the receiver according to the invention are constructed in digital circuit technology. As a result of the reduction in the analog components associated with this considerable independence from production tolerances and compatibility with other technologies can be achieved. The filter coefficients of the digital cable approximation filter can be stored in a memory, for example a ROM- or RAM-memory, so that the digital cable approximation filter also subsequently in service can be adapted to various characteristics of the transmission path or the transmission cable, which in the case of analog technology is basically not possible. Due to the use of digital circuit technology generally wide-ranging parameterizability and therefore easy adaptability also during routine operation of these digital circuit components is the case. Apart from the previously mentioned cable approximation filter, this also refers for example to the signal detector provided in the receiver, the equalizer control unit as well as generally the digital filters used in the receiver. Furthermore the compatibility of the receiver as regards input jitter can be improved by way of the present invention. No high clock rates are necessary for internal signal processing. Scanning of the incoming signal by the A/D-converter can therefore be decreased to a scanning rate of 1.6 for example.

As the result of additional decimation of the high pass filtered digital signal fed to the cable approximation filter, the required circuit surface area and current consumption for this digital cable approximation filter can be considerably reduced. Through the previously described sequence and combination of the circuit blocks (A/D-converter, digital high pass filter, digital low pass filter, digital cable approximation filter and interpolator) both the requirement for a high clock resolution in the case of data recovery as well as the requirement for minimum circuit complexity with regard to the digital cable approximation filter can be met. The proposed generally digital-based technology of the receiver therefore represents optimisation of the requirements for high clock resolution in the unit described as "Clock and Data Recovery Unit" for data and clock recovery as well as the requirement for minimum circuit complexity. In addition with the aid of the present invention non-scrambled data can be processed. Known methods of digital signal processing, which require scrambled data (as for example in the case of DSL transmission systems ("Digital Subscriber Line")) could not be used in the case of the solution to the aim detailed at the beginning, since in particular a reconstruction of non-scrambled data using the present invention will be possible according to the aim. Furthermore known methods of digital signal processing, which have an affect on the data being transmitted, could not be used in the case of the solution to the aim detailed at the beginning, since this is not possible owing to the requirements of some data transmission standards (for example EI-/T1-/J1-/E3-/STSI-standard).

The present invention can generally be used to reconstruct data transmitted over any desired transmission path in a receiver. Preferably however the present invention to reconstruct data transmitted over a cable-based transmission path, for example a copper or glass fibre cable, is used.

The present invention is explained in more detail below with reference to the attached drawing by way of preferred embodiments.

Figure 2:
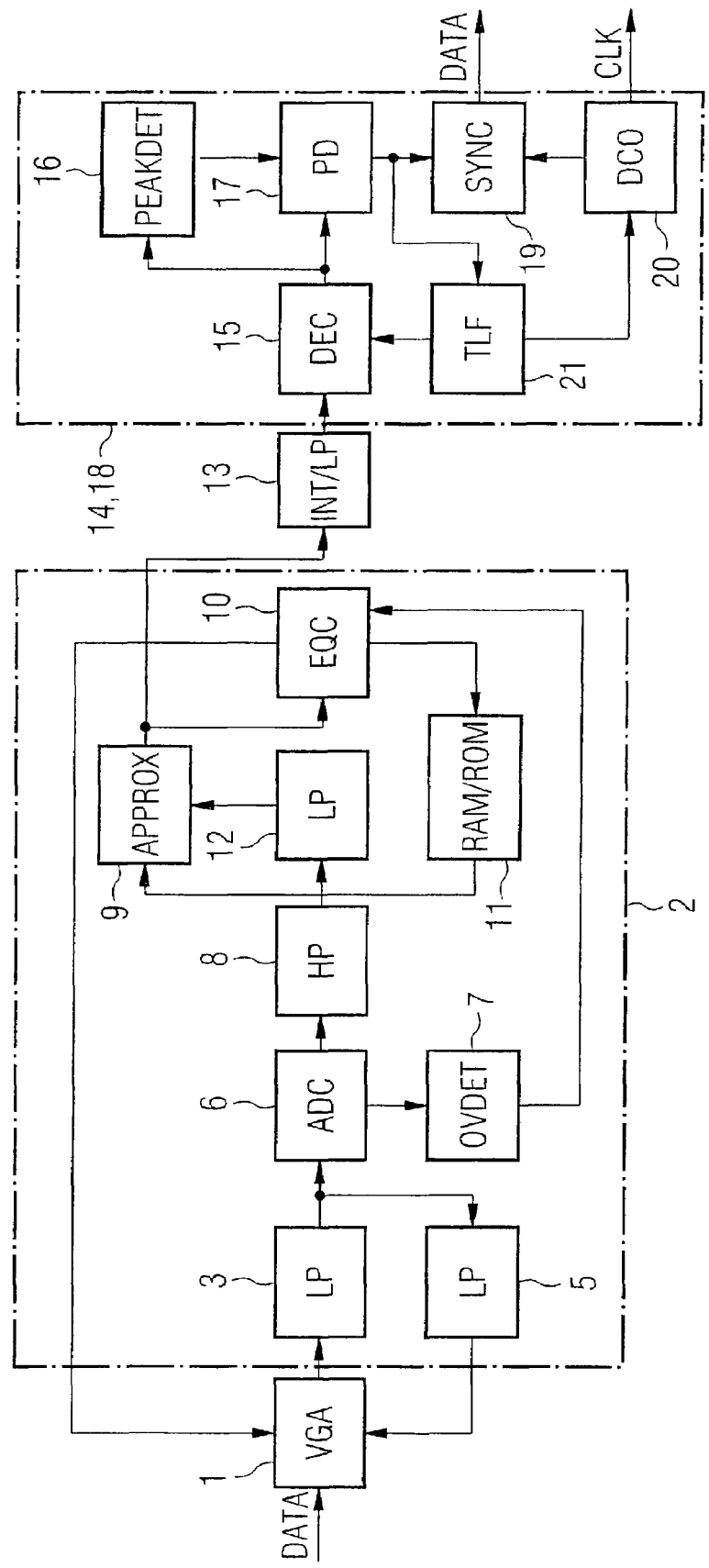

FIG. 1 shows a simplified block circuit diagram of a receiver primarily based on digital technology according to a first embodiment of the present invention, FIG. 2 shows a simplified block circuit diagram of a receiver primarily based on digital technology according to a second embodiment of the present invention, and FIG. 3 shows a simplified block circuit diagram of a receiver generally based on analog technology according to the state of the art.

The receiver shown in FIG. 1 comprises a variable or programmable amplifier 1, which is fed to the data signal DATA received over the particular transmission path or the particular transmission cable, in order to amplify this to compensate cable attenuation.

An equalizer 2, which on the input end has an analog low pass filter 3 as antialiasing filter, which at the same time is used as a noise filter and to suppress crosstalk joins onto the variable amplifier 1. A circuit block 4 ("LPTUN") serves as filter tuning for the analog low pass filter 3, in order to ensure pole stability of the analog low pass filter 3. In this case the filter tuning or pole position of the analog low pass filter 3 depending in each case on the transmission standard is carried with the data rate. A further analog low pass filter 5 serves to suppress offset and is arranged in a feedback path, which connects the output of the analog low pass filter 3 with a control input of the variable amplifier 1. Dependent on this the output signal of the analog low pass filter 5 acts upon the amplification of the variable amplifier 1.

The analog data signal filtered by the analog low pass filter is fed to an A/D-converter 6 ("A/D-converter", ADC). This A/D-converter 6 scans the analog data signal fed to it at a relatively low sampling rate, so that the analog data signal is made discrete and a corresponding digital data signal is obtained. The sampling rate or frequency of the A/D-converter 6 can in this case preferably be kept relatively low and is to be found in the so-called Nyquist frequency range or can be even lower. Thus for example scanning at 1.6 to 2 times signal frequency is possible. The A/D-converter 6 can be designed in the form of a Sigma-Delta A/D-converter, whereby the sampling rate amongst others is dependent on the ordinal being implemented and the type of analog low pass filter 3. The analog low pass filter 3 can for example be designed as a Butterworth or Bessel filter, whereby a Butterworth filter in comparison to a Bessel filter has the advantage that in the case of equal sequence a steeper progression of the frequency response can be achieved, although Butterworth filters in comparison to Bessel filters do not have a constant group delay time and therefore have an asymmetric pulse response.

The A/D-converter 6 is directly connected after a digital high pass filter 8 ("high pass filter", HP), which suppresses noise sources or offset and equal components below a pre-set lower limit frequency, especially below the minimum spectral component of the data signal.

The output of the digital high pass filter 8 is connected with a further digital filter 9, which compensates any channel distortion during the data transmission caused for example by the cable or a transformer on the transmitting end etc. and can be designed as an FIR filter ("Finite Impulse Response") or IIR filter ("Infinite Impulse Response"). The digital filter 9 compensates the channel distortion to simulate the inverse transmission function of the transmission channel and therefore is also described as cable approximation filter.

The digital output signal of the digital cable approximation filter 9 is fed to an equalizer-control unit 10, which, dependent on the signal amplitude, adjusts the amplification of the variable amplifier 1 and the filter coefficients of the digital cable approximation filter 9. These filter coefficients are stored in a memory 11, for example a RAM- or ROM-memory, and are suitably selected by the equalizer control unit 10 for optimum simulation of the inverse transmission function of the transmission channel. The equalized data signal emitted by the digital cable approximation filter 9 is used to recover the original clock rate as well as the originally sent data from this. For this purpose with the embodiment shown in FIG. 1 in order to improve the subsequent clock and data recovery the data rate of the equalized signal is increased after the digital cable approximation filter 9 by an interpolation unit 13. This is necessary in order to produce additional sampling values for the already equalized digital data signal and to obtain additional phase information for the data and clock recovery. The interpolation type (linear, quadratic or exponential) will be selected dependent on the expected signal form, while the interpolation arrangement will be selected dependent on the required sampling values and therefore the minimum required additional phase information. The digital interpolation unit 13 ("INT") is preferably supplemented by a subsequent digital low pass filter, which filters out any additional noise sources caused by the preceding interpolation unit from the wanted or data signal. This digital low pass filter can therefore be designed as a form filter to suppress quantisation noises whereby the arrangement of this digital low pass filter is oriented towards the grade and arrangement of the interpolation.

Overloading of the signal input of the A/D-converter 6 is detected by a unit 7 (OVDET) which dependent on this acts upon the variable amplifier 1 via the equalizer control unit 10.

The data signal prepared and equalized in the way described above is fed to a circuit block, which performs the function of the phase locked loop 14 shown in FIG. 3 as well as the clock and data recovery unit 18 shown in FIG. 3. The control loop of the phase locked loop comprises a controlled decimator 15 ("Decimator", DEC) or frequency splitter, a phase detector 17 ("Phase Detector", PD) as well as a device to regulate the clock or phase regulation response with a so-called "Timing Loop" filter 21 (TLF) and a digitally controlled oscillator 20 ("Digitally Controlled Oscillator", DCO). The phase detector 17 identifies the phase error of the detected data related to the recovered clock CLK and independently of this triggers the "Timing Loop" filter 21, which in its turn triggers the decimator 15 accordingly to adjust the clock. In addition with the embodiment illustrated in FIG. 1 an amplitude detector 16 ("Peak Detector", PEAK-DET) is provided to readjust an amplitude threshold value used in the phase detector 17. The oscillator 20 triggered by the "Timing Loop" filter 21 generates the regenerated clock CLK, which is also fed to a synchronization unit 19 (SYNC) to synchronise the output data, whereby this synchronisation unit 19, synchronous with the regenerated clock CLK of the digitally controlled oscillator 20, emits a data stream with the re-constructed or recovered data DATA.

The decimator 15 of the phase locked loop described above reduces the clock rate, which results in a reduction in surface area requirement and power consumption of the subsequent circuit components. Furthermore the low pass characteristic of the decimator 15 can be exploited for additional suppression of noise sources.

A further embodiment of a receiver according to the invention is illustrated in FIG. 2, whereby those circuit components, which correspond to the circuit components already shown in FIG. 1, have been given the same references. To avoid repetition reference is made to the above description regarding these circuit components.

In the case of the embodiment shown in FIG. 2 the digital signal emitted and filtered by the digital high pass filter 8 and high pass filtered digital signal is not fed directly to the digital cable approximation filter 9, but via a digital low pass filter 12. This digital low pass filter 12 serves to suppress crosstalk and noise sources to band demarcate the input signal. Otherwise the embodiment illustrated in FIG. 2 corresponds to the embodiment shown in FIG. 1, however the filter tuning unit 4 shown in FIG. 1 not being illustrated in FIG. 2, in order to indicate that the desired effect does not necessarily require a separate circuit block for active filter-tuning, but can also be achieved by other measures known by the person skilled in the art.

The invention claimed is:

1. Method of reconstructing data transmitted over a transmission path in a receiver, comprising the steps of:
   a) amplification of a signal received by the receiver over the transmission path corresponding to the transmitted data,
   b) making discrete the signal amplified in step a) with the aid of an A/D-converter, in order to obtain a suitable digital signal,
   c) filtering of the digital signal obtained in step b) with the aid of a digital high pass filter,
   d) compensation of distortion of the signal occurring through the transmission over the transmission path with the aid of a digital filter, is fed to the high pass filtered digital signal in step c), in order to obtain a suitable equalized digital signal, and
   c) recovery of the data originally transmitted over the transmission path from the equalized digital signal obtained in step d),
   wherein the amplified signal is filtered with the aid of an analog low pass filter between steps a) and b), and
   wherein the signal emitted by the analog low pass filter to suppress offset is filtered with the aid of a further analog low pass filter, whereby the signal emitted by this further analog low pass filter to adjust the amplification, with which the signal received by the receiver is amplified in step a), is used.

2. Method of reconstructing data transmitted over a transmission path in a receiver, comprising the steps of:
   a) amplification of a signal received by the receiver over the transmission path corresponding to the transmitted data,
   b) making discrete the signal amplified in step a) with the aid of an A/D-converter, in order to obtain a suitable digital signal,
   c) filtering of the digital signal obtained in step b) with the aid of a digital high pass filter,
   d) compensation of distortion of the signal occurring through the transmission over the transmission path with the aid of a digital filter, is fed to the high pass filtered digital signal in step c), in order to obtain a suitable equalized digital signal, and
   c) recovery of the data originally transmitted over the transmission path from the equalized digital signal obtained in step d),
   wherein the amplified signal is filtered with the aid of an analog low pass filter between steps a) and b), and
   wherein the position of poles of the analog low pass filter is continually adjusted dependent on the data rate of the signal received by the receiver.

3. Method according to claim 1, wherein a Sigma-Delta A/D-converter is used in step b) as the A/D-converter.

4. Method according to claim 1, wherein in step c) the digital signal is filtered with the aid of the digital high pass filter to suppress noise sources below a minimum spectral component of the digital signal.

5. Method of reconstructing data transmitted over a transmission path in a receiver, comprising the steps of:
   a) amplification of a signal received by the receiver over the transmission path corresponding to the transmitted data,
   b) making discrete the signal amplified in step a) with the aid of an A/D-converter, in order to obtain a suitable digital signal,
   c) filtering of the digital signal obtained in step b) with the aid of a digital high pass filter,
   d) compensation of distortion of the signal occurring through the transmission over the transmission path with the aid of a digital filter, is fed to the high pass filtered digital signal in step c), in order to obtain a suitable equalized digital signal, and
   e) recovery of the data originally transmitted over the transmission path from the equalized digital signal obtained in step d),
   wherein between steps c) and d) a low pass filtering of the digital signal emitted by the digital high pass filter is carried out with the aid of a digital low pass filter.

6. Method according to claim 5, wherein the low pass filtering is carried out to suppress crosstalk and noise sources in the digital signal emitted by the digital high pass filter.

7. Method reconstructing data transmitted over a transmission path in a receiver, comprising the steps of:
   a) amplification of a signal received by the receiver over the transmission path corresponding to the data,
   b) making discrete the signal amplified in step a) with the aid of an A/D-converter, in order to obtain a suitable digital signal,
   c) filtering of the digital signal obtained in step b) with the aid of a digital high pass filter,
   d) compensation of distortion of the signal occurring through the transmission over the transmission path with the aid of a digital filter, is fed to the high pass filtered digital signal in step c), in order to obtain a suitable equalized digital signal, and
   e) recovery of the data originally transmitted over the transmission path from the equalized digital signal obtained in step d),
   wherein filter coefficients of the digital filter used in step d) are adjusted dependent on the equalized signal obtained in step d).

8. Method according to claim 7, wherein the various filter coefficients sets for the digital filter used in step d) are stored, whereby dependent on the amplitude of the equalized digital signal obtained in step d) one of the filter coefficients set valid for the digital filter used in step d) is selected in each case.

9. Method of reconstructing data transmitted over a transmission path in a receiver, comprising the steps of:
   a) amplification of a signal received by the receiver over the transmission path corresponding to the transmitted data,
   b) making discrete the signal amplified in step a) with the aid of an A/D-converter, in order to obtain a suitable digital signal,
   c) filtering of the digital signal obtained in step b) with the aid of a digital high pass filter,
   d) compensation of distortion of the signal occurring through the transmission over the transmission path with the aid of a digital filter, is fed to the high pass filtered digital signal in step c) in order to obtain a suitable equalized digital signal, and e) recovery of the data originally transmitted over the transmission path from the equalized digital signal obtained in step d), wherein overloading is detected at the input of the A/D-converter used in step b) and dependent on this the amplification is adjusted, with which the signal received by the receiver in step a) is amplified.

10. Method of reconstructing data transmitted over a transmission path in a receiver, comprising the steps of:

a) amplification of a signal received by the receiver over the transmission path corresponding to the transmitted data, b) making discrete the signal amplified in step a) with the aid of an A/D-converter, in order to obtain a suitable digital signal, c) filtering of the digital signal obtained in step b) with the aid of a digital high pass filter, d) compensation of distortion of the signal occurring through the transmission over the transmission path with the aid of a digital filter, is fed to the high pass filtered digital signal in step c) in order to obtain a suitable equalized digital signal, and e) recovery of the data originally transmitted over the transmission path from the equalized digital signal obtained in step d), wherein the equalized digital signal obtained in step d) is interpolated to increase the clock rate before step c) has been carried out.

11. Method according to claim 10, wherein the equalized digital signal obtained in step d) is filtered after interpolation and before step e) have been carried out with the aid of a digital low pass filter.

12. Method according to claim 1, wherein a signal clock is regenerated in step e) using a phase locked loop and synchronous with it the recovered data are emitted.

13. Method according to claim 12, wherein the equalized digital signal interpolated in the phase locked loop is decimated to reduce the clock rate.

14. Method according to claim 13, wherein the decimation of the interpolated equalized digital signal is controlled via a digital filter of the phase locked loop.

15. Method according to claim 13, wherein the phase locked loop comprises a phase detector which is readjusted dependent on the amplitude of the decimated and interpolated equalized digital signal.

16. Device to re-construct data transmitted over transmission path, comprising:

a) an amplifier to amplify a signal corresponding to the data transmitted and received over the transmission path, b) and A/D-converter to make discrete the signal amplified by the amplifier, in order to obtain a suitable digital signal, c) a digital high pass filter connected after the A/D-converter to filter the digital signal, d) a further digital high pass filter connected after the digital high pass filter to compensate distortion of the signal occurring through the transmission over the transmission path, in order to receive an equalized digital signal, and e) a data recovery unit to recover the data originally transmitted over the transmission path from the equalized digital signal emitted by the digital filter, wherein an analog low pass filter is arranged between the amplifier and the A/D-converter, and wherein the amplifier is variable, and that a further analog low pass filter, the output signal of which adjusts the amplification of the amplifier, is connected with the output of the analog low pass filter.

17. Device to re-construct data transmitted over a transmission path, comprising:

a) an amplifier to amplify a signal corresponding to the data transmitted and received over the transmission path, b) an A/D-converter to make discrete the signal amplified by the amplifier, in order to obtain a suitable digital signal, c) a digital high pass filter connected after the A/D-converter to filter the digital signal, d) a further digital high pass filter connected after the digital high pass filter to compensate distortion of the signal occurring through the transmission over the transmission path, in order to receive an equalized digital signal, and e) a data recovery unit to recover the data originally transmitted over the transmission path from the equalized digital signal emitted by the digital filter, wherein an analog low pass filter is arranged between the amplifier and the A/D-converter, and wherein means are provided to continually adjust the position of poles of the analog low pass filter dependent on the data rate of the signal fed to the amplifier.

18. Device to re-construct data transmitted over a transmission path, comprising:

a) an amplifier to amplify a signal corresponding to the data transmitted and received over the transmission path, b) an A/D-converter to make discrete the signal amplified by the amplifier, in order to obtain a suitable digital signal, c) a digital high pass filter connected after the A/D-converter to filter the digital signal, d) a further digital high pass filter connected after the digital high pass filter to compensate distortion of the signal occurring through the transmission over the transmission path, in order to receive an equalized digital signal, and e) a data recovery unit to recover the data originally transmitted over the transmission path from the equalized digital signal emitted by the digital filter, wherein a digital low pass filter is provided between the digital high pass filter and the digital filter to compensate distortion of the signal.

19. Device according to claim 18, wherein the low pass filtering is carried out to suppress crosstalk and noise sources in the digital signal emitted by the digital high pass filter.

20. Device re-construct data transmitted over a transmission path, comprising:

a) an amplifier to amplify a signal corresponding to the data transmitted and received over the transmission path, b) an A/D-converter to make discrete the signal amplified by the amplifier, in order to obtain a suitable digital signal, c) a digital high pass filter connected after the A/D-converter to filter the digital signal, d) a further digital high pass filter connected after the digital high pass filter to compensate distortion of the signal occurring through the transmission over the transmission path, in order to receive an equalized digital signal, and e) a data recovery unit to recover the data originally transmitted over the transmission path from the equalized digital signal emitted by the digital filter, wherein storage means are provided to store a plurality of filter coefficient sets for the digital filter, and control means select a valid filter coefficient set from the storage means for the digital filter.

21. Device to re-construct data transmitted over a transmission path, comprising:

a) an amplifier to amplify a signal corresponding to the data transmitted and received over the transmission path, b) an A/D-converter to make discrete the signal amplified by the amplifier, in order to obtain a suitable digital signal, c) a digital high pass filter connected after the A/D-convener to filter the digital signal, d) a further digital high pass filter connected after the digital high pass filter to compensate distortion of the signal occurring through the transmission over the transmission path, in order to receive an equalized digital signal, and e) a data recovery unit to recover the data originally transmitted over the transmission path from the equalized digital signal emitted by the digital filter, wherein the amplifier is variable, and that means are provided to detect overloading at the input of the A/D-converter and to adjust the amplification of the amplifier.

22. Device to re-construct data transmitted over a transmission path, comprising:

a) an amplifier to amplify a signal corresponding to the data transmitted and received over the transmission path, b) an A/D-converter to make discrete the signal amplified by the amplifier, in order to obtain a suitable digital signal, c) a digital high pass filter connected after the A/D-converter to filter the digital signal, d) a further digital high pass filter connected after the digital high pass filter to compensate distortion of the signal occurring through the transmission over the transmission path, in order to receive an equalized digital signal, and e) a data recovery unit to recover the data originally transmitted over the transmission path from the equalized digital signal emitted by the digital filter, wherein between the digital filter and the data recovery unit interpolator to interpolate the equalized digital signal emitted by the digital filter is provided to increase the clock rate.

23. Device according to claim 22, wherein a digital low pass filter is provided between the interpolator and the data recovery unit.

24. Device according to claim 16, wherein the data recovery unit comprises a phase locked loop to generate a signal clock corresponding to the signal received and to emit the recovered data synchronous with this clock.

25. Device according to claim 24, wherein the phase locked loop comprises a decimator to reduce the clock rate of the signal emitted by the interpolator.

26. Device according to claim 25, wherein the phase locked loop comprises a phase detector and a digital filter, to which the output signal of the phase-detector is fed, and in that an output signal of this digital filter is fed to the decimator for corresponding control of the decimator.

27. Device according to claim 26, wherein means are provided to re-adjust the phase detector dependent on the output signal of the decimator.

28. The method of claim 1, wherein in step b) to make discrete the signal amplified in step a), the signal is scanned with a sampling frequency, which is less than the Nyquist frequency of the signal.

29. The method of claim 1, wherein the signal amplified in step a) is filtered with the aid of the analog low pass filter to suppress antialiasing.

30. The method of claim 7, wherein the amplification, with which the signal received by the receiver is amplified in step a), is adjusted dependent on the equalized signal obtained in step d).

* * * * *